(12) United States Patent
Hong et al.

(10) Patent No.: US 12,713,741 B2
(45) Date of Patent: Aug. 18, 2026

(54) LIGHT EMITTING DIODE PACKAGE

(71) Applicant: Seoul Semiconductor Co., Ltd., Ansan-si (KR)

(72) Inventors: Seung Sik Hong, Ansan-si (KR); Motonobu Takeya, Ansan-si (KR)

(73) Assignee: Seoul Semiconductor Co., Ltd., Ansan-si (KR)

(*) Notice: Subject to any disclaimer, the term of this patent is extended or adjusted under 35 U.S.C. 154(b) by 120 days.

(21) Appl. No.: 17/875,358

(22) Filed: Jul. 27, 2022

(65) Prior Publication Data

US 2022/0367761 A1 Nov. 17, 2022

Related U.S. Application Data

(63) Continuation of application No. 16/482,854, filed as application No. PCT/KR2018/001366 on Feb. 1, 2018, now Pat. No. 11,456,401.

(30) Foreign Application Priority Data

Feb. 2, 2017 (KR) ........................ 10-2017-0014861

(51) Int. Cl.
*H10H 20/851* (2025.01)
*H10H 20/01* (2025.01)
(Continued)

(52) U.S. Cl.
CPC .... *H10H 20/8512* (2025.01); *H10H 20/8511* (2025.01); *H10H 20/8514* (2025.01);
(Continued)

(58) Field of Classification Search
CPC ......... H01L 33/50–507; H01L 25/0753; H01L 33/44; H01L 33/58; H01L 2933/0041;
(Continued)

(56) References Cited

U.S. PATENT DOCUMENTS 6,744,077 B2 * 6/2004 Trottier .................. H10H 20/84 257/89
7,250,715 B2 * 7/2007 Mueller ............. C09K 11/7774 313/485

(Continued)

FOREIGN PATENT DOCUMENTS

CN 103779375 5/2014
CN 103843163 6/2014

(Continued)

OTHER PUBLICATIONS

Korean Office Action issued Dec. 6, 2023 in Korean Patent Application No. 10-2017-0014861, 4 pages.

(Continued)

*Primary Examiner* — Maliheh Malek
(74) *Attorney, Agent, or Firm* — Oblon, McClelland, Maier & Neustadt, L.L.P.

(57) ABSTRACT

A light emitting device including a light emitting diode chip configured to emit a primary light having a peak wavelength, a wavelength conversion layer disposed to cover an upper portion of the light emitting diode chip and configured to convert a wavelength of the primary light emitted from the light emitting diode chip, and a color filter layer disposed to cover an upper portion of the wavelength conversion layer and configured to block at least a portion of the primary light from being emitted through the wavelength conversion layer and transmit light having a wavelength longer than the peak wavelength, in which the at least portion of the primary light includes a wavelength equal to or less than the peak wavelength.

18 Claims, 7 Drawing Sheets

(51) Int. Cl.
*H10H 20/855* (2025.01)
*H10W 90/00* (2026.01)

(52) U.S. Cl.
CPC ........ *H10W 90/00* (2026.01); *H10H 20/0361* (2025.01); *H10H 20/855* (2025.01)

(58) Field of Classification Search
CPC ........... H10H 20/8512; H10H 20/8511; H10H 20/8514; H10H 20/0361; H10H 20/855; H10H 20/851; H10H 20/84; H10H 20/0363; H10H 20/85; H10W 90/00
See application file for complete search history.

(56) References Cited

U.S. PATENT DOCUMENTS 7,791,093 B2 * 9/2010 Basin .................. H10H 20/854 257/98
7,884,538 B2 * 2/2011 Mitsuishi ........... H10H 20/8513 313/506
9,219,240 B1 * 12/2015 Liang .................. H10K 71/231
9,236,414 B2 * 1/2016 Matsuura .............. H10H 29/10
9,704,833 B2 * 7/2017 Kong .................... H10H 29/14
9,735,322 B2 * 8/2017 Oh ...................... H10H 20/854
9,741,907 B2 * 8/2017 Oh ..................... H10H 20/8513
10,096,586 B2 * 10/2018 Kim ...................... H10W 90/00
10,096,750 B2 * 10/2018 Choi ................. H10H 20/8513
10,276,760 B2 * 4/2019 Song ................. H10H 20/8511
10,361,248 B2 * 7/2019 Lee ...................... H10H 29/142
10,651,172 B2 * 5/2020 Ha ......................... H10D 84/83
10,797,027 B2 * 10/2020 Takeya .................... H10P 72/74
10,811,572 B2 * 10/2020 Kim .................. C09K 11/0883
10,902,756 B2 * 1/2021 Choi .................... G02B 6/0026
11,043,430 B2 * 6/2021 Kim .................. H10D 84/0193
11,164,869 B2 * 11/2021 Ha ......................... H10D 84/83
11,462,663 B2 * 10/2022 Kim ..................... H10H 20/841
11,502,229 B2 * 11/2022 Kang .................. H10H 20/855
11,575,018 B2 * 2/2023 Kim ..................... H10D 64/667
11,621,376 B2 * 4/2023 Kim ..................... H10H 20/841 362/84
2001/0026127 A1 * 10/2001 Yoneda .................. H10K 59/38 313/506
2005/0224830 A1 * 10/2005 Blonder ............. H10H 20/8515 257/E25.02
2006/0012288 A1 * 1/2006 Terakado ........... H10K 59/8722 313/506
2006/0055309 A1 * 3/2006 Ono ...................... H10W 90/00 257/E33.059
2006/0226759 A1 * 10/2006 Masuda ............. H10H 20/8513 313/486
2007/0018102 A1 * 1/2007 Braune .................. H10H 20/84 977/773
2007/0114559 A1 * 5/2007 Sayers ................... H10H 20/84 257/100
2008/0117500 A1 * 5/2008 Narendran ......... H10H 20/8512 257/E33.059
2008/0150882 A1 * 6/2008 Langendijk .......... G09G 3/3607 345/102
2009/0026908 A1 * 1/2009 Bechtel .............. C09K 11/7774 313/110
2009/0057699 A1 * 3/2009 Basin ................... H10H 20/854 257/E33.059
2009/0261366 A1 * 10/2009 Eisert ................... H10H 20/841 257/98
2010/0109025 A1 * 5/2010 Bhat .................. H10H 20/8515 257/E33.056
2010/0264432 A1 * 10/2010 Liu ....................... H10W 90/00 257/E33.056
2010/0265384 A1 * 10/2010 Tay ....................... H10F 39/024 257/E31.127
2010/0283382 A1 * 11/2010 Kwak ................ C09K 11/7731 313/503
2011/0133218 A1 * 6/2011 Lee ...................... H10H 20/853 257/E33.073
2011/0182056 A1 * 7/2011 Trottier .............. H10H 20/8515 362/293
2011/0254039 A1 * 10/2011 Kim ..................... H10H 20/851 438/27
2012/0032200 A1 * 2/2012 Kwon .................. H10H 20/851 257/E33.061
2012/0043552 A1 * 2/2012 David ................ H10H 20/8513 257/E33.025
2012/0302124 A1 * 11/2012 Imazu ................ H10H 20/8506 445/58
2013/0075773 A1 * 3/2013 Kijima ................ H10H 20/851 257/98
2013/0128548 A1 * 5/2013 Lin .................. G02F 1/133617 362/97.1
2014/0048821 A1 * 2/2014 Inoue .................. H10H 20/825 257/103
2014/0175492 A1 * 6/2014 Steranka ............... F21S 41/155 257/98
2014/0319553 A1 * 10/2014 Ye ............................ F21K 9/64 257/89
2014/0340891 A1 * 11/2014 Hyun ........................ F21V 9/08 362/351
2014/0362885 A1 * 12/2014 Sakuta ................ H10H 20/851 372/44.01
2015/0003040 A1 * 1/2015 Bessho ............. H10H 20/8515 362/84
2015/0014725 A1 * 1/2015 Hong ................ H10H 20/8512 362/351
2015/0085527 A1 * 3/2015 Nam .................... H10H 20/856 438/27
2015/0129916 A1 * 5/2015 Bera ................. H10H 20/8513 257/98
2015/0255505 A1 * 9/2015 Jeoung ................. G06F 1/1652 257/89
2015/0280076 A1 * 10/2015 Schricker .............. H10H 20/84 257/89
2015/0316215 A1 * 11/2015 Togawa .................... F21K 9/20 362/231
2015/0323711 A1 * 11/2015 Bessho ............ G02F 1/133606 349/71
2016/0190105 A1 * 6/2016 Rhee ..................... H10W 90/00 257/76
2016/0254421 A1 * 9/2016 Reiherzer .......... H10H 20/8513 257/89
2017/0025399 A1 * 1/2017 Takeya .................. H10W 90/00
2017/0025589 A1 * 1/2017 Chang .................. H10H 20/854
2017/0044431 A1 * 2/2017 Lin ...................... C09K 11/617
2017/0092820 A1 * 3/2017 Kim ..................... H10H 20/851
2017/0133567 A1 * 5/2017 Fukasawa ............ H10H 20/857
2017/0236866 A1 * 8/2017 Lee ...................... H10H 29/142 257/89
2017/0287887 A1 * 10/2017 Takeya ................... H10H 29/45
2018/0012949 A1 * 1/2018 Takeya .................. H10W 90/00
2018/0019384 A1 * 1/2018 Abe ..................... H10H 20/856
2018/0047880 A1 * 2/2018 Lim .................. H10H 20/8515
2018/0074372 A1 * 3/2018 Takeya .............. G02F 1/133602
2018/0076252 A1 * 3/2018 Togashi ................ H10F 39/151
2018/0090650 A1 * 3/2018 Takeda ................ H10H 20/857
2018/0102350 A1 * 4/2018 Kim ...................... H10W 90/00
2018/0123008 A1 * 5/2018 Imai ..................... H10H 20/857
2018/0158998 A1 * 6/2018 Imai .................. H10H 20/8515
2018/0233494 A1 * 8/2018 Takeya ................. H10W 90/00
2019/0033659 A1 * 1/2019 Lin .................. G02F 1/133514
2019/0128482 A1 * 5/2019 Jiang ....................... F21K 9/232
2019/0189613 A1 * 6/2019 Ha ......................... H10D 84/83
2019/0198719 A1 * 6/2019 Fujioka ........... C09K 11/77342
2019/0229097 A1 * 7/2019 Takeya .................... H10P 72/74
2019/0304346 A1 * 10/2019 Choi .................... G02B 6/0026
2019/0320517 A1 * 10/2019 Nakanishi ............. H05B 33/22
2020/0051959 A1 * 2/2020 Pschenitzka .......... H10W 90/00
2020/0052172 A1 * 2/2020 Abe ..................... H10H 20/856
2020/0118982 A1 * 4/2020 Ukawa ................. H10W 90/00
2020/0127173 A1 * 4/2020 Park .................. H10H 20/8513
2020/0279979 A1 * 9/2020 Lee .................... H10H 20/8513
2020/0313045 A1 * 10/2020 Asai .................. C09K 11/7734
2020/0335403 A1 * 10/2020 Kim .................. H10D 84/0193
2021/0028383 A1 * 1/2021 Manders ................ H10K 59/32

(56) References Cited

U.S. PATENT DOCUMENTS

| | | | | |
|---|---|---|---|---|
| 2021/0050491 | A1* | 2/2021 | Sun | H10H 20/8512 |
| 2021/0119087 | A1* | 4/2021 | Kim | H10H 20/841 |
| 2021/0132440 | A1* | 5/2021 | Kim | H10H 20/841 |
| 2021/0208329 | A1* | 7/2021 | Choi | G02B 6/0068 |
| 2021/0288103 | A1* | 9/2021 | Hong | H10H 29/142 |
| 2021/0317326 | A1* | 10/2021 | Doherty | F21V 9/30 |
| 2021/0328038 | A1* | 10/2021 | Kim | H10D 64/667 |
| 2021/0391510 | A1* | 12/2021 | Choi | H10W 90/00 |
| 2022/0223764 | A1* | 7/2022 | Asai | C09K 11/7734 |
| 2023/0022191 | A1* | 1/2023 | Kim | H10H 20/841 |
| 2023/0037888 | A1* | 2/2023 | Yeon | H10H 29/142 |
| 2023/0083851 | A1* | 3/2023 | Jansen | H10H 20/8513 252/301.4 R |
| 2023/0146060 | A1* | 5/2023 | Park | H10D 64/017 257/324 |
| 2023/0163213 | A1* | 5/2023 | Lee | H10D 30/62 257/30 |
| 2023/0170398 | A1* | 6/2023 | Park | H10D 62/121 257/288 |
| 2023/0215930 | A1* | 7/2023 | Chung | H10D 30/43 257/30 |
| 2023/0223391 | A1* | 7/2023 | Lee | G06F 30/392 257/401 |
| 2023/0238441 | A1* | 7/2023 | Park | H10D 30/6735 257/288 |
| 2023/0268412 | A1* | 8/2023 | Jung | H10D 30/6735 257/288 |
| 2023/0298945 | A1* | 9/2023 | Yang | H10D 30/43 |
| 2023/0307448 | A1* | 9/2023 | Lee | H10D 88/00 |
| 2023/0420552 | A1* | 12/2023 | Park | H10D 64/258 |
| 2024/0006562 | A1* | 1/2024 | Kim | H10H 20/841 |

FOREIGN PATENT DOCUMENTS

| | | | |
|---|---|---|---|
| JP | 2007-88348 | A | 4/2007 |
| JP | 2013-229593 | A | 11/2013 |
| JP | 2016-72471 | A | 5/2016 |
| KR | 10-2011-0115506 | | 10/2011 |
| KR | 10-2012-0063815 | | 6/2012 |
| KR | 10-2013-0017067 | | 2/2013 |
| KR | 10-2013-0022595 | | 3/2013 |
| KR | 10-2017-0000512 | | 1/2017 |
| TW | 200421683 | | 10/2004 |

OTHER PUBLICATIONS

International Search Report mailed May 14, 2018, in International Application No. PCT/KR2018/001366 (with English Translation).

Sun et al., "Packaging efficiency in phosphor-converted white LEDs and its impact to the limit of luminous efficacy", Journal of Solid State Lighting, 2014, pp. 1-17, Springer, United States.

Non-Final Office Action dated Jan. 7, 2021, in U.S. Appl. No. 16/482,854.

Final Office Action dated Jun. 15, 2021, in U.S. Appl. No. 16/482,854.

Non-Final Office Action dated Sep. 15, 2021, in U.S. Appl. No. 16/482,854.

Notice of Allowance dated Apr. 28, 2022, in U.S. Appl. No. 16/482,854.

Chinese Office Action issued from the State Intellectual Property Office of the People's Republic of China on May 5, 2022, for corresponding Chinese Application 201880005226.7 (with English Concise Explanation).

Korean Office Action issued Aug. 19, 2024 in Korean Patent Application No. 10-2017-0014861, 5 pages.

* cited by examiner

LIGHT EMITTING DIODE PACKAGE

CROSS-REFERENCE TO RELATED APPLICATIONS

This application is a Continuation of U.S. patent application Ser. No. 16/482,854, filed Aug. 1, 2019, which is a National Stage Entry of International Application No. PCT/KR2018/001366, filed on Feb. 1, 2018, and claims priority from and the benefit of Korean Patent Application No. 10-2017-0014861, filed on Feb. 2, 2017, each of which are hereby incorporated by reference for all purposes as set forth herein.

BACKGROUND

Field

Exemplary embodiments of the present disclosure relate to a light emitting diode package, and more particularly, to a light emitting diode package including a phosphor layer.

Discussion of the Background

A light emitting diode is an inorganic semiconductor device which emits light generated by recombination of electrons and holes. In recent years, light emitting diodes have been widely used in various fields, such as display devices, vehicular lamps, general lighting, and the like. With advantages such as longer lifespan, lower power consumption, and quicker response, light emitting diodes have been rapidly replacing existing light sources.

There are various methods for displaying white light using the light emitting diode, such as using a light emitting diode emitting blue light, a light emitting diode emitting green light, and a light emitting diode emitting red light. In this case, it is relatively easy to manufacture the light emitting diodes emitting blue light and green light without wavelength conversion, but it is relatively difficult to manufacture the light emitting diode emitting red light, due to high manufacturing cost and low yield. Therefore, for the light emitting diode emitting red light, a light emitting diode package is mainly used, which converts wavelength of blue light or ultraviolet light emitted from the light emitting diode emitting blue light or ultraviolet light to emit red light to the outside.

FIG. 1 is a cross-sectional view of a conventional light emitting diode package.

Referring to FIG. 1, the conventional light emitting diode package is a package using the light emitting diode as described above. The conventional light emitting diode package includes a light emitting diode chip 12 and a phosphor layer 13.

A substrate 11 supports the light emitting diode package, and the light emitting diode package is disposed on the substrate 11.

The light emitting diode chip 12 is disposed on the substrate 11, and emits monochromatic light. For example, the light emitting diode chip 12 in the conventional light emitting diode package may emit blue light or ultraviolet light. In this case, to emit red light, a red phosphor layer 13 covers the light emitting diode chip 12 to convert blue light or ultraviolet light into red light. The red phosphor layer 13 may wavelength-convert blue light or ultraviolet light emitted from the light emitting diode chip 12 and emit red light to the outside.

In this case, however, the conventional light emitting diode package emits not only red light but also a portion of blue light to the outside.

FIGS. 2A through 2C are cross-sectional views of another conventional light emitting diode packages, and FIG. 3A and FIG. 3B are graphs showing intensities of light according to wavelengths of the light emitting diode packages shown in FIGS. 1 through 2C.

Each of the conventional light emitting diode packages shown in FIGS. 2A through 2C is a conventional light emitting diode package for preventing blue light from being emitted to the outside while red light is emitted to the outside through the light emitting diode package shown in FIG. 1.

The light emitting diode package shown in FIG. 2A has a structure in which a thickness of the phosphor layer 13 disposed on an upper portion of the light emitting diode chip 12 is increased to minimize blue light emitted together with red light from the light emitting diode package shown in FIG. 1.

Spectrums of light emitted from the conventional light emitting diode packages are compared through the graph shown in FIG. 3A. Referring to FIG. 3A, BR102Q is used as a red phosphor for conventional light emitting diode packages. A first one of the light emitting diode packages includes a phosphor layer having 100% of the red phosphor BR102Q in a resin and disposed on the light emitting diode chip 12 in a shape as shown in FIG. 1, a second one of the light emitting diode packages includes a phosphor layer having 150% of the red phosphor BR102Q and disposed on the light emitting diode chip 12 in a shape as shown in FIG. 1, and a third one of the light emitting diode packages includes 150% of the red phosphor BR102Q and disposed on the light emitting diode chip 12 in a shape as shown in FIG. 2A.

As can be seen from the graph, blue light may be reduced when the phosphor layer 13 of the light emitting diode package includes 150% or more of red phosphor, or when the thickness of the phosphor layer 13 disposed on the upper portion of the light emitting diode chip 12 is increased.

However, when the amount of the phosphor included in the phosphor layer 13 is increased as described above, productivity and operability of the light emitting diode package are lowered. In addition, increasing the thickness of the phosphor layer 13 may increase the size of the product, and decrease the color gamut due to limitation of realization of the red color.

Referring to FIG. 2B, a wall 15 may be disposed on both sides of the light emitting diode chip 12, and the phosphor layer 13 may be disposed over the wall 15 and the light emitting diode chip 12 (Type A). Referring to FIG. 2C, the phosphor layer 13 may be disposed to cover the entire light emitting diode chip 12, and the wall 15 may be disposed on side surfaces of the phosphor layer 13 (Type B). Accordingly, blue light or ultraviolet light emitted from the side surfaces of the light emitting diode chip 12 may be blocked, thereby reducing emission of blue light or ultraviolet light from the light emitting diode package.

As shown in the graph of FIG. 3B, even if the structures of the light emitting diode packages are modified as shown in FIGS. 2B and 2C, it can be seen that blue light is reduced only in light emitted from the light emitting diode package (Type B) of FIG. 2C. However, both Types A and B have the limitation in realization of red, and have a disadvantage of decreasing the color gamut. In addition, as the thickness of the phosphor layer 13 becomes thicker, there is a disadvantage in that an overall size of the package is increased.

The above information disclosed in this Background section is only for understanding of the background of the inventive concepts, and, therefore, it may contain information that does not constitute prior art.

SUMMARY

Exemplary embodiments of the present disclosure provide a light emitting diode package having desired color gamut without increasing the size of the light emitting diode package.

A light emitting diode package according to an exemplary embodiment includes a light emitting diode chip, a phosphor layer disposed to cover an upper portion of the light emitting diode chip, the phosphor layer being configured to convert a wavelength of light emitted from the light emitting diode chip, and a color filter layer disposed to cover an upper portion of the phosphor layer, the color filter being configured to block light having a predetermined wavelength range from being emitted through the phosphor layer.

The phosphor layer may be disposed to cover side surfaces and the upper portion of the light emitting diode chip, and the color filter layer may be disposed to cover side surfaces and the upper portion of the phosphor layer.

The light emitting diode chip may be configured to emit blue light or ultraviolet light.

The phosphor layer may be configured to emit red light by wavelength-converting blue light or ultraviolet light emitted from the light emitting diode chip.

The color filter layer may block blue light or ultraviolet light among light emitted through the phosphor layer.

A thickness of the color filter layer may be in a range of 0.5 μm to 3 μm.

The phosphor layer may include one or more types of phosphors.

The light emitting diode package may further include a wall disposed on the side surface of the light emitting diode chip to reflect light emitted from the light emitting diode chip.

The phosphor layer may be disposed over the light emitting diode chip and the wall.

The wall may contact the light emitting diode chip.

The wall may be spaced apart from the light emitting diode chip.

The phosphor layer may be disposed to cover the side surfaces and the upper portion of the light emitting diode chip, the color filter layer may be disposed to cover the side surfaces and the upper portion of the phosphor layer, and the wall may contact a side surface of the color filter layer.

An upper surface of the wall and an upper surface of the color filter layer may be on the same plane.

A peak wavelength emitted from the light emitting diode chip may be in a range of 445 nm to 455 nm.

The color filter layer may have a thickness in a range of 0.5 μm to 3 μm.

A method of forming a light emitting diode package according to another exemplary embodiment includes the steps of providing a light emitting diode chip on a substrate, disposing a liquid including a phosphor on the light emitting diode chip and curing the liquid to form a phosphor layer configured to convert a wavelength of light emitted from the light emitting diode chip, and forming a color filter layer on the phosphor layer by a spin coating method to block light having a predetermined wavelength range from being light emitted through the phosphor layer.

The step of forming the color filter layer may include coating the color filter layer at a spin speed of 3000 rpm to 6000 rpm.

The spin coating may be conducted for about 5 to 90 seconds, such that the color filter layer has a thickness in a range of 0.5 μm to 3 μm.

The steps may further include forming a wall substantially parallel to a side surface of the light emitting diode chip to reflect light emitted therefrom.

The wall contacts the side surface of the light emitting diode chip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
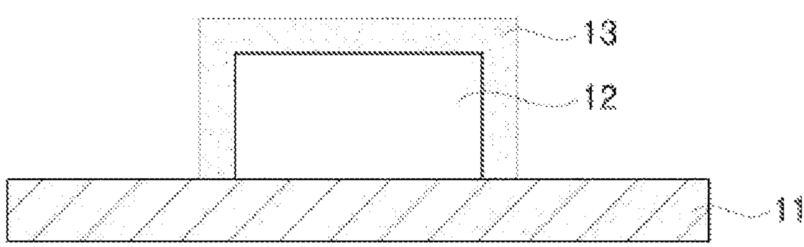
FIG. 1 is a cross-sectional view of a conventional light emitting diode package.
Figure 2A:
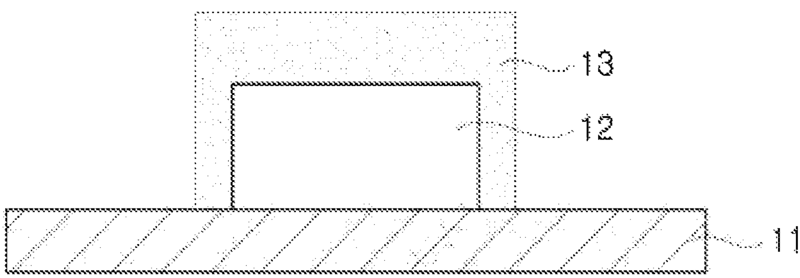
FIGS. 2A, 2B, and 2C are cross-sectional views of another conventional light emitting diode packages.
Figure 2B:
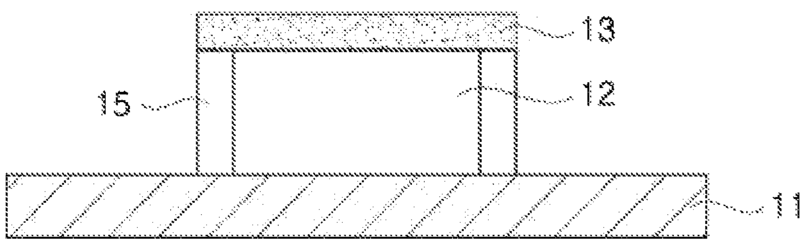
Figure 2C:
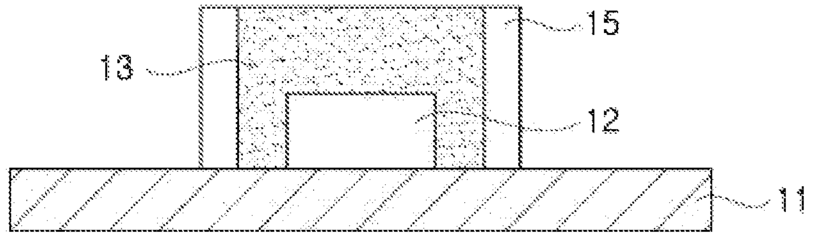
Figure 3A:
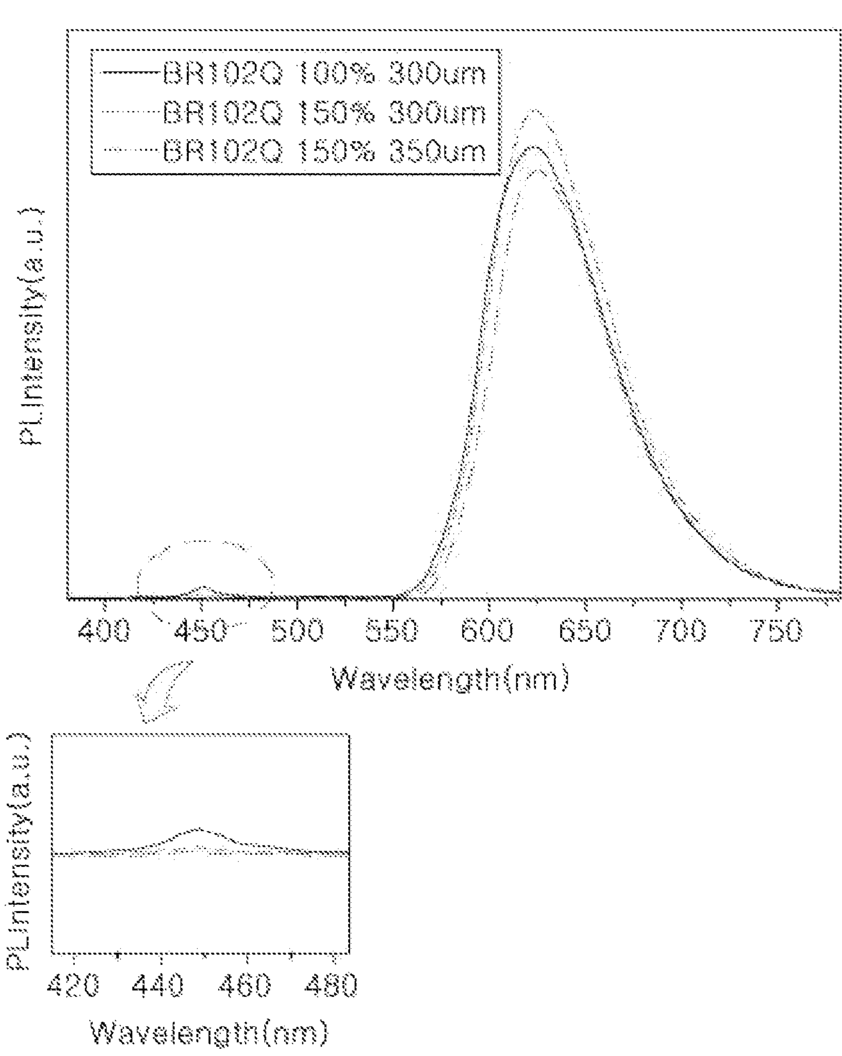
FIG. 3A and FIG. 3B are graphs showing intensities of light according to wavelengths of the light emitting diode packages shown in FIGS. 1 through 2C.
Figure 3B:
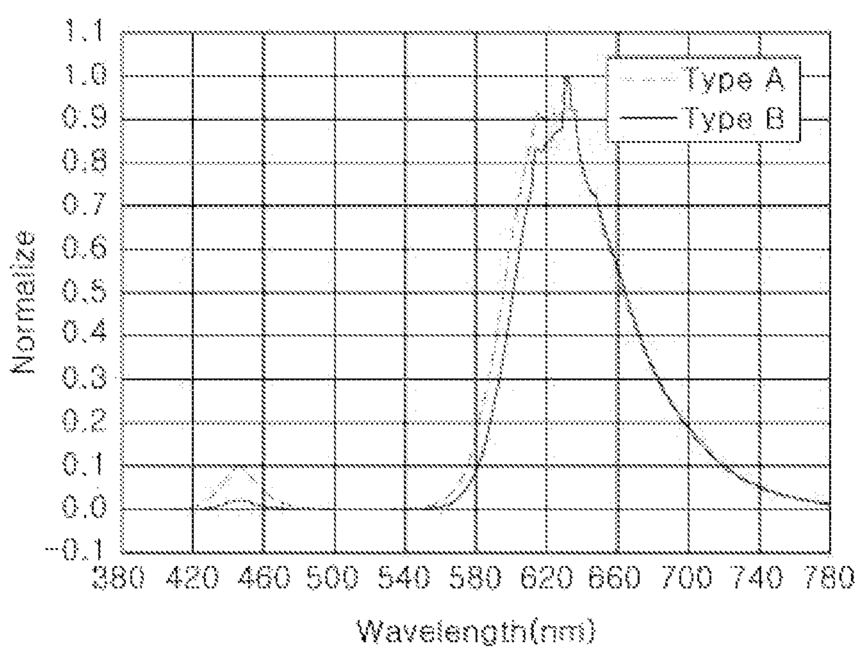

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 4:
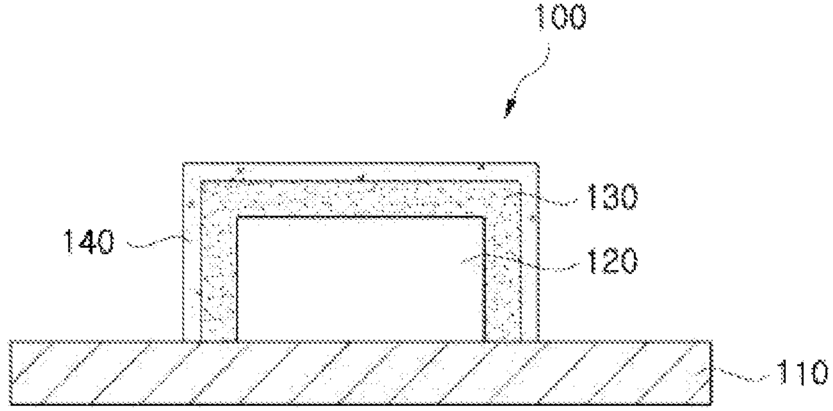
FIG. 4 is a cross-sectional view of a light emitting diode package according to an exemplary embodiment of the present disclosure.

FIG. 4 is a cross-sectional view of a light emitting diode package according to an exemplary embodiment of the present disclosure.

Referring to FIG. 4, a light emitting diode package 100 according to an exemplary embodiment includes a light emitting diode chip 120, a phosphor layer 130, and a color filter layer 140.

The light emitting diode chip 120 may be disposed on a substrate 110, and may emit light by an external power source. According to the illustrated exemplary embodiment, the light emitting diode chip 120 may emit blue light or ultraviolet light, and may include an n-type semiconductor layer, an active layer, and a p-type semiconductor layer.

Each of the n-type semiconductor layer, the active layer, and the p-type semiconductor layer may include a III-V compound semiconductor, and may include a nitride semiconductor, such as (Al, Ga, In)N.

The n-type semiconductor layer may be a conductive semiconductor layer including an n-type impurity (for example, Si), and the p-type semiconductor layer may be a conductive semiconductor layer including a p-type impurity (for example, Mg). The active layer may be interposed between the n-type semiconductor layer and the p-type semiconductor layer, and may include a multiple quantum well structure (MQW). A composition ratio may be determined to emit light having a desired peak wavelength.

According to the illustrated exemplary embodiment, a light emitting diode emitting blue light or ultraviolet light may be used as the light emitting diode chip 120. For example, a peak wavelength emitted from the light emitting diode chip 120 may be in a range of 445 nm to 455 nm. Since the light emitting diode package 100 according to an exemplary embodiment is configured to emit red light to the outside, a wavelength of blue light or ultraviolet light emitted from the light emitting diode chip 120 may be converted. Accordingly, as shown in FIG. 4, the phosphor layer 130 is disposed to cover the light emitting diode chip 120.

The phosphor layer 130 may include one or more types of phosphors capable of wavelength-converting blue light or ultraviolet light and emitting red light to the outside. More particularly, the phosphor layer 130 may include one or more types of phosphors and a carrier, such as silicone, that supports the one or more types of phosphors. If necessary, the phosphor layer 130 may be disposed as a compressed mixture of the one or more types of phosphors, glass beads, and the like. In this case, the phosphor layer 130 may include a nitride-based or a fluoride-based red phosphor.

The color filter layer 140 may be disposed to cover the phosphor layer 130. The color filter layer 140 is disposed to block light having a wavelength equal to or less than a certain wavelength from being emitted through the phosphor layer 130. In the illustrated exemplary embodiment, the color filter layer 140 may block a portion of light emitted from the light emitting diode chip 120. For example, when the peak wavelength of light emitted from the light emitting diode chip 120 is 445 nm to 455 nm, the color filter may block light of 455 nm or less, and transmit light of 455 nm or more.

The color filter layer 140 may be disposed to cover the phosphor layer 130, and may be coated through spin coating or the like. Accordingly, the color filter layer 140 may be formed to have a desired thickness according to a spin speed (rpm) and a coating time. For example, the color filter layer 140 may be coated at a spin speed of 3000 rpm to 6000 rpm for about 5 to 90 seconds. Accordingly, the thickness of the color filter layer 140 may be 0.5 μm to 3 μm, without being limited thereto.

The thickness of the color filter layer 140 may be determined in consideration of a peak wavelength, color coordinates, light loss of red light emitted from the light emitting diode package 100, and the like.

According to an exemplary embodiment, a method of manufacturing the light emitting diode package 100 will be briefly described as follows.

A plurality of light emitting diode chips 120 are disposed on the substrate 110 so as to be spaced apart from one another, and the phosphor layer 130 is disposed to cover the entire light emitting diode chips 120. In this case, the phosphor layer 130 may be in a liquid state having a viscosity, and may be disposed to cover each light emitting diode chip 120 and fill a space between the light emitting diode chips 120. When the phosphor layer 130 covering the light emitting diode chip 120 is cured, it is subjected to a dicing process so that the light emitting diode chips 120 may be divided from one another. At this time, a grinding process may be added to the upper portion of the phosphor layer 130 in consideration of the thickness of the phosphor layer 130.

Then, the color filter layer 140 may be formed through the spin coating process so as to cover the light emitting diode chip 120 on which the phosphor layer 130 is disposed. As described above, the color filter layer 140 may be coated at the spin speed of 3000 rpm to 6000 rpm for about 5 to 90 seconds, and formed to have the thickness of about 0.5 μm to 3 μm. After the color filter layer 140 is formed through spin coating, unnecessary portions of the color filter layer 140 may be removed by an addition dicing process or the like. Although the color filter layer 140 is described as being formed through the spin coating process in the illustrated exemplary embodiment, however, the color filter layer 140 may be formed through another process.

Figure 5A:
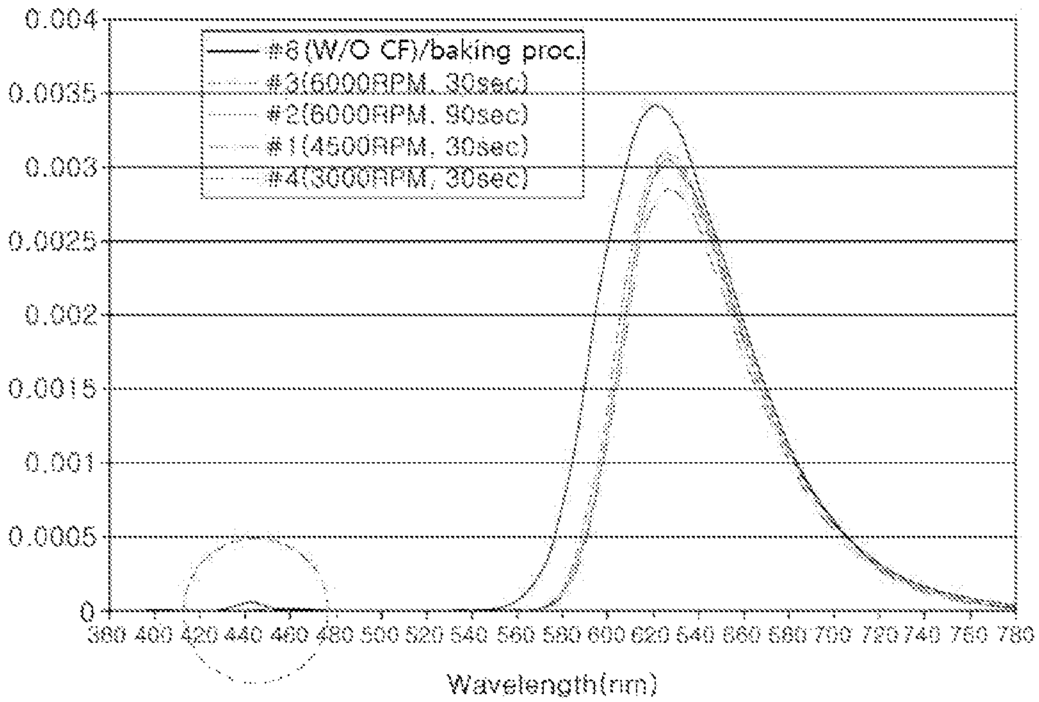
FIGS. 5A and 5B are graphs comparing intensities of light according to wavelengths of the light emitting diode package according to an exemplary embodiment of the present disclosure with those of a conventional light emitting diode package.
Figure 5B:
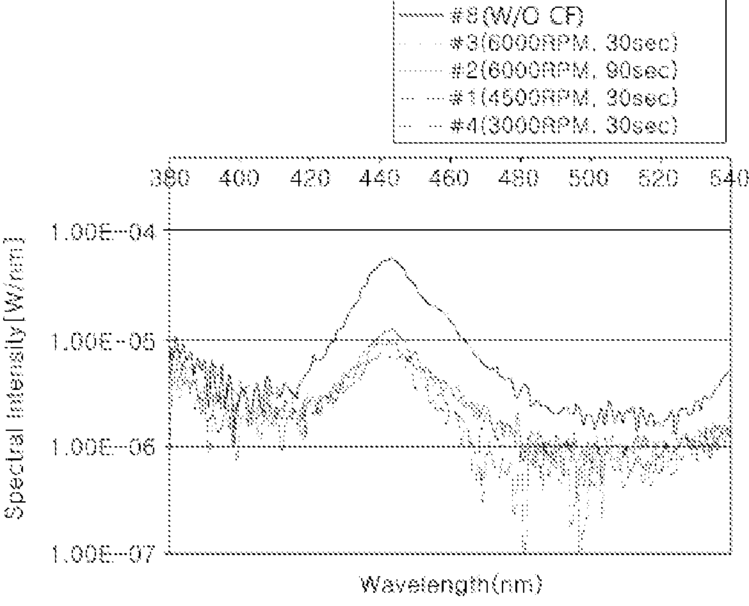

FIGS. 5A and 5B are graphs comparing intensities of light according to wavelengths of the light emitting diode package according to exemplary embodiments of the present disclosure with those of a conventional light emitting diode package.

FIG. 5A is a graph showing the intensity of light emitted from the light emitting diode package 100 according to exemplary embodiments of the present disclosure shown in FIG. 4, and the intensity of light emitted from the conventional light emitting diode package 100 shown in FIG. 1. More specifically, Graphs #1 through #4 are graphs of light emitted from the light emitting diode package 100 where the phosphor layer 130 and the color filter layer 140 are disposed over the light emitting diode chip 120, and Graph #8 is a graph of light emitted from the light emitting diode package 100 where only the phosphor layer 130 is disposed over the light emitting diode chip 120.

Graph #1 shows the intensity of light emitted from the light emitting diode package 100 coated with the color filter layer 140 at a spin rate of 4500 rpm for 30 seconds, and Graph #2 shows the intensity of light emitted from the light emitting diode package 100 coated with the color filter layer 140 at a spin rate of 6000 rpm for 90 seconds. Graph #3 shows the intensity of light emitted from the light emitting diode package 100 coated with the color filter layer 140 at a spin rate of 6000 rpm for 30 seconds, and Graph #4 shows the intensity of light emitted from the light emitting diode package 100 with the color filter layer 140 at a spin rate of 3000 rpm for 30 seconds.

Graph #8 shows the intensity of light emitted from the light emitting diode package 100, in which only the phosphor layer 130 is disposed on the light emitting diode chip 120 without the color filter layer 140.

It can be seen from these graphs that the intensity of red light emitted from the light emitting diode package 100 including the color filter layer 140 is slightly reduced as compared with the conventional light emitting diode package, but a peak at the wavelength of the blue light band is hardly observed. Accordingly, it can be seen that blue light having the wavelength band of 445 nm to 455 nm emitted from the light emitting diode package 100 according to exemplary embodiments the present embodiment is remarkably reduced compared to the conventional one.

FIG. 5B is an enlarged graph of blue light of the wavelength band of 445 nm to 455 nm. As shown in the drawing, it can be more clearly confirmed that blue light of the wavelength band of 445 nm to 455 nm is reduced in the light emitting diode package 100 including the color filter layer 140 corresponding to Graphs #1 through #4, compared with that corresponding to Graph #8.

Figure 6:
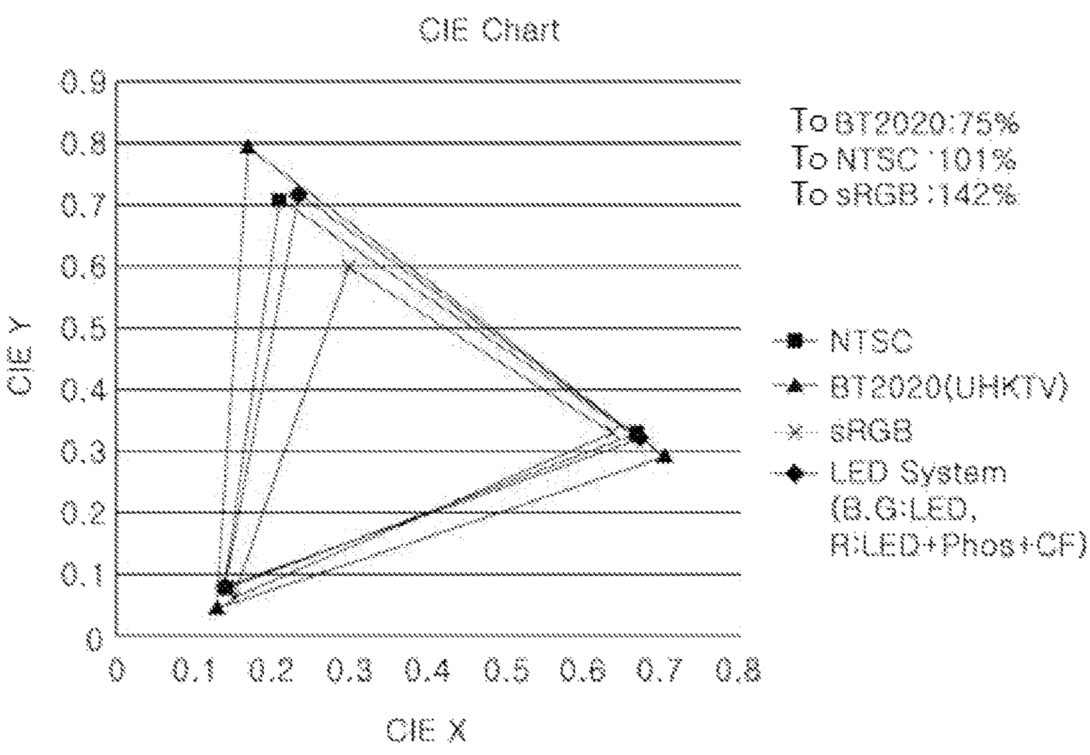
FIG. 6 is a graph showing color coordinates of white light using a light emitting diode package according to an exemplary embodiment of the present disclosure.

FIG. 6 is a graph showing color coordinates of white light using a light emitting diode package according to an exemplary embodiment of the present disclosure.

Red light is realized by using the light emitting diode package 100 according to an exemplary embodiment, and, together with the red light, white light is realized by using blue light emitted from a blue light emitting diode chip, and green light emitted from a green light emitting diode chip. FIG. 6 shows a comparison of the color coordinates of the white light according to an exemplary embodiment with values of the standard color coordinates. Referring to FIG. 6, a light emitting diode system configured according to an exemplary embodiment includes the blue light emitting diode chip, the green light emitting diode chip, and the red light emitting diode package 100.

It can be seen that CIE-color coordinate of the light emitting diode system is 75% of the BT2020 standard, 101% of the NTSC standard, and 142% of the sRGB standard. Accordingly, it is possible to increase a color coordinate area ratio with respect to each standard.

Figure 7:
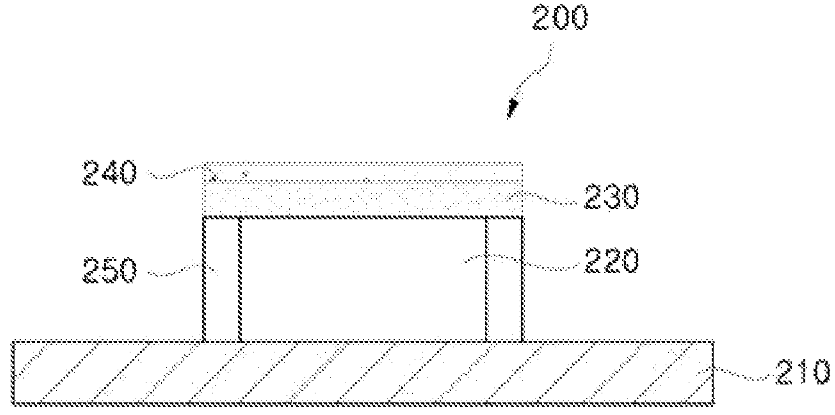
FIG. 7 is a cross-sectional view of a light emitting diode package according to another exemplary embodiment of the present disclosure.

FIG. 7 is a cross-sectional view of a light emitting diode package according to another exemplary embodiment of the present disclosure.

Referring to FIG. 7, a light emitting diode package 200 according to another exemplary embodiment includes a light emitting diode chip 220, a phosphor layer 230, a color filter layer 240, and a wall 250. The light emitting diode package 200 according to the illustrated exemplary embodiment is substantially similar to the light emitting diode package 100 shown in FIG. 4. Accordingly, repeated descriptions of the substantially the same elements of the light emitting diode package 200 will be omitted.

The light emitting diode chip 220 is disposed on the substrate 210. The wall 250 is disposed to surround side surfaces of the light emitting diode chip 220. In this case, the wall 250 may be disposed in contact with the light emitting diode chip 220, and may be disposed at the same elevation as the light emitting diode chip 220. The wall 250 may be formed in white color so that light emitted from the light emitting diode chip 220 may not be transmitted but be reflected. Accordingly, light may be emitted to an upper portion of the light emitting diode chip 220.

The phosphor layer 230 may be disposed to cover the upper portion of the light emitting diode chip 220 and the upper portion of the wall 250. Accordingly, light emitted upward in the light emitting diode chip 220 may be wavelength-converted through the phosphor layer 230 and emitted to the outside.

Further, the color filter layer 240 may be disposed over the phosphor layer 230. According to the illustrated exemplary embodiment, the color filter layer 240 may not be disposed on the side surfaces of the phosphor layer 230, but disposed to cover only the upper portion of the phosphor layer 230, and may block light having a wavelength equal to or less than a certain wavelength from light emitted through the upper portion of the phosphor layer 230. The color filter layer 240 may be formed through spin coating as described above, and a thickness thereof may be determined in consideration of a peak wavelength, color coordinates, light loss of the emitted light, and the like.

Figure 8:
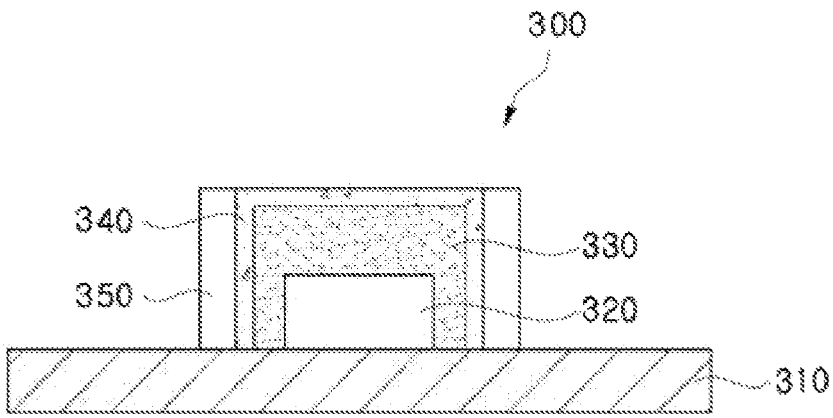
FIG. 8 is a cross-sectional view of a light emitting diode package according to still another exemplary embodiment of the present disclosure.

FIG. 8 is a cross-sectional view of a light emitting diode package according to still another exemplary embodiment of the present disclosure.

Referring to FIG. 8, a light emitting diode package 300 according to still another exemplary embodiment includes a light emitting diode chip 320, a phosphor layer 330, a color filter layer 340, and a wall 350. The light emitting diode package 200 according to the illustrated exemplary embodiment is substantially similar to the light emitting diode package 100 shown in FIG. 4. Accordingly, repeated descriptions of the substantially the same elements of the light emitting diode package 300 will be omitted.

The light emitting diode chip 320 is disposed on the substrate 310. The phosphor layer 330 is disposed to cover side surfaces and an upper surface of the light emitting diode chip 320, and may include one or more types of phosphors therein.

The color filter layer 340 may be disposed to cover the phosphor layer 130. The color filter layer 340 blocks light having a wavelength equal to or shorter than a certain wavelength from light emitted through the phosphor layer 330. The wall portion 350 is disposed to surround side surfaces of the color filter layer 340. In this case, the wall 350 may be disposed to be in contact with the side surfaces of the color filter layer 340, and light emitted from the light emitting diode chip 320 may be reflected by the wall 350 and emitted upwardly.

In consideration of an overall size of the light emitting diode package 300, a size of the light emitting diode chip 320 may be smaller than those described above. Accordingly, the size of the light emitting diode package 100 or 200 described above and that of the light emitting diode package 300 according to the illustrated exemplary embodiment may be substantially similar to each other.

In accordance with aspects of the present disclosure, when red light is realized by using a blue light emitting diode chip, an ultraviolet light emitting diode chip, and a phosphor without using a red light emitting diode chip, it is possible to prevent emission of blue light or ultraviolet light together with red light by blocking blue light or ultraviolet light with a color filter layer coated on a phosphor layer, such that only red light may be emitted to the outside.

As described above, by using the color filter layer, red color coordinates of red light emitted from the light emitting diode package may be realized, and a desired red color ranging from pure red to deep red may be displayed.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A light emitting device comprising:

a substrate;

a light emitting diode chip disposed on the substrate and configured to emit a primary light having a peak wavelength;

a wavelength converter disposed to cover an upper region of the light emitting diode chip, the wavelength converter being configured to convert a wavelength of the primary light emitted from the light emitting diode chip; and a color filter disposed to cover an upper region of the wavelength converter and not cover side surfaces of the wavelength converter, wherein the color filter is configured to selectively block a portion of the primary light having the peak wavelength that is transmitted through the wavelength converter or emitted from the light emitting diode chip without wavelength conversion, and transmit light having a wavelength longer than the peak wavelength, wherein the portion of the primary light includes a wavelength equal to or less than the peak wavelength.

2. The light emitting device of claim 1, wherein the light emitting diode chip is configured to emit blue light or ultraviolet light.

3. The light emitting device of claim 1, wherein the portion of the primary light is configured to be emitted through the wavelength converter without wavelength conversion.

4. The light emitting device of claim 2, wherein the color filter is configured to block blue light or ultraviolet light among light emitted through the wavelength converter.

5. The light emitting device of claim 1, wherein a thickness of the color filter is in a range of 0.5 μm to 3 μm.

6. The light emitting device of claim 1, further comprising a wall disposed on a side surface of the light emitting diode chip to surround the light emitting diode chip.

7. The light emitting device of claim 6, wherein the wall is configured to reflect light emitted from the light emitting diode chip.

8. The light emitting device of claim 6, wherein the wavelength converter contacts a surface of the wall.

9. The light emitting device of claim 6, wherein the color filter is disposed on the wall.

10. A light emitting device comprising:

a substrate;

a light emitting diode chip disposed on the substrate and configured to emit light having a peak wavelength;

a wavelength converter disposed to cover an upper region of the light emitting diode chip, the wavelength converter being configured to convert a wavelength of light emitted from the light emitting diode chip; and a color filter disposed to cover an upper region of the wavelength converter and not cover side surfaces of the wavelength converter, wherein the color filter is configured to selectively block a portion of the light having the peak wavelength that is transmitted through the wavelength converter or emitted from the light emitting diode chip without wavelength conversion, and transmit light having a wavelength longer than the peak wavelength, wherein the selectively blocked portion of the light includes a wavelength equal to or less than the peak wavelength.

11. The light emitting device of claim 10, wherein the light emitting diode chip is configured to emit blue light or ultraviolet light.

12. The light emitting device of claim 10, wherein the color filter is configured to transmit light having a wavelength longer than the peak wavelength.

13. The light emitting device of claim 11, wherein the color filter is configured to block blue light or ultraviolet light among light emitted through the wavelength converter.

14. The light emitting device of claim 10, wherein a thickness of the color filter is in a range of 0.5 μm to 3 μm.

15. The light emitting device of claim 10, further comprising a wall disposed on a side surface of the light emitting diode chip to surround the light emitting diode chip.

16. The light emitting device of claim 15, wherein the wall is configured to reflect light emitted from the light emitting diode chip.

17. The light emitting device of claim 15, wherein the wavelength converter contacts a surface of the wall.

18. The light emitting device of claim 15, wherein the color filter is disposed on the wall.

* * * * *